United States Patent
Wen

(10) Patent No.: US 9,117,509 B2
(45) Date of Patent: Aug. 25, 2015

(54) ELECTRONIC APPARATUS, DRAM CONTROLLER, AND DRAM

(71) Applicant: MediaTek Inc., Hsin-Chu (TW)

(72) Inventor: Chih-Chiang Wen, Jhudong Township, Hsinchu County (TW)

(73) Assignee: MEDIATEK INC., Hsin-Chu (TW)

( * ) Notice: Subject to any disclaimer, the term of this patent is extended or adjusted under 35 U.S.C. 154(b) by 189 days.

(21) Appl. No.: 13/719,610

(22) Filed: Dec. 19, 2012

(65) Prior Publication Data

US 2013/0201779 A1 Aug. 8, 2013

Related U.S. Application Data

(60) Provisional application No. 61/594,450, filed on Feb. 3, 2012.

(51) Int. Cl.
| | |
|---|---|
| *G11C 8/18* | (2006.01) |
| *G11C 7/10* | (2006.01) |
| *G11C 29/02* | (2006.01) |
| *G11C 11/40* | (2006.01) |

(52) U.S. Cl.
CPC *G11C 8/18* (2013.01); *G11C 7/109* (2013.01); *G11C 7/1093* (2013.01); *G11C 29/023* (2013.01); *G11C 29/028* (2013.01); *G11C 11/40* (2013.01); *G11C 2207/2254* (2013.01)

(58) Field of Classification Search
None
See application file for complete search history.

(56) References Cited

U.S. PATENT DOCUMENTS

| | | | | |
|---|---|---|---|---|
| 7,876,629 B2* | 1/2011 | Tseng | | 365/193 |
| 8,816,780 B2* | 8/2014 | Wang et al. | | 331/25 |
| 2008/0304608 A1* | 12/2008 | Ishida | | 375/371 |
| 2011/0142112 A1* | 6/2011 | Lin et al. | | 375/224 |

FOREIGN PATENT DOCUMENTS

| | | |
|---|---|---|
| CN | 1912643 A | 2/2007 |
| CN | 101364425 A | 2/2009 |
| CN | 101854161 A | 10/2010 |
| EP | 2413504 | 7/2011 |

* cited by examiner

*Primary Examiner* — Kretelia Graham
(74) *Attorney, Agent, or Firm* — McClure, Qualey & Rodack, LLP

(57) ABSTRACT

The invention provides an electronic apparatus. The electronic apparatus includes a Dynamic Random Access Memory (DRAM) and a DRAM controller. The DRAM receives at least one control and address signal and a clock signal, delays the clock signal by a predetermined value to obtain a delayed clock signal, samples the control and address signal according to the clock signal to obtain a first sample signal, samples the control and address signal according to the delayed clock signal to obtain a second sample signal, and compares the first sample signal with the second sample signal to obtain a status signal. The DRAM controller sends the control and address signal and the clock signal to the DRAM, receives the status signal from the DRAM, and adjusts a phase difference between the clock signal and the control and address signal according to the status signal.

31 Claims, 4 Drawing Sheets

ELECTRONIC APPARATUS, DRAM CONTROLLER, AND DRAM

CROSS REFERENCE TO RELATED APPLICATIONS

This application claims the benefit of U.S. Provisional Application No. 61/594,450, filed on Feb. 3, 2012, the entirety of which is incorporated by reference herein.

BACKGROUND OF THE INVENTION

1. Field of the Invention

The invention relates to memories, and more particularly to a Dynamic Random Access Memory (DRAM).

2. Description of the Related Art

A low power double data rate (LPDDR) DRAM is a type of double data rate synchronous DRAM for mobile computers. The circuit design of an LPDDR DRAM is modified to reduce overall power consumption thereof. A new JEDEC standard JESD209-2E is referred to as an LPDDR2. The LPDDR2 DRAM operates at a low supply voltage of 1.2V. In comparison to LPDDR2 DRAM, LPDDR3 DRAM offers a higher data rate, greater bandwidth and power efficiency, and higher memory density.

Specifically, in LPDDR2 DRAM and LPDDR3 DRAM, the LPDDR DRAM is coupled to a DRAM controller via a control and address bus. The control and address (CA) bus comprises 10 control and address lines coupled between the DRAM controller and the DRAM. The control and address lines operate at a frequency which is double of that of a clock signal and therefore have a double data rate. The DRAM controller sends commands and addresses to the DRAM via the control and address bus, and the DRAM then accesses the commands and the addresses from the control and address bus according to the clock signal.

The phase difference between the clock signal and control and address signals transmitted via the control and address bus must be kept at constant level. If the phase difference between the clock signal and the control and address signals varies with time, because the operating frequency of the control and address bus is double of that of the clock signal, when the DRAM accesses the data of the control and address signals according to the clock signal with a changed phase, the DRAM tends to obtain error data due to the varied phase difference. The phases of the clock signal and control and address signals transmitted via the control and address bus, however, changes with temperature, the operating voltage, and manufacture process of the DRAM controller. Thus, a system which automatically adjusts the phases of the clock signal and the control and address signals to keep the phase difference at constant levels is required.

BRIEF SUMMARY OF THE INVENTION

The invention provides an electronic apparatus. In one embodiment, the electronic apparatus comprises a Dynamic Random Access Memory (DRAM) and a DRAM controller. The DRAM receives at least one control and address signal and a clock signal, delays the clock signal by a predetermined value to obtain a delayed clock signal, samples the control and address signal according to the clock signal to obtain a first sample signal, samples the control and address signal according to the delayed clock signal to obtain a second sample signal, and compares the first sample signal with the second sample signal to obtain a status signal. The DRAM controller sends the at least one control and address signal and the clock signal to the DRAM, receives the status signal from the DRAM, and adjusts a phase difference between the clock signal and the at least one control and address signal according to the status signal.

The invention also provides a Dynamic Random Access Memory (DRAM) controller. In one embodiment, the DRAM controller is coupled to a DRAM, sends at least one control and address signal and a clock signal to the DRAM, and receives a status signal from the DRAM. In one embodiment, the DRAM controller comprises a phase adjustment circuit. The phase adjustment circuit adjusts a phase difference between the clock signal and the at least one control and address signal sent to the DRAM according to the status signal, wherein the DRAM delays the clock signal by a predetermined value to obtain a delayed clock signal, samples the control and address signal according to the clock signal to obtain a first sample signal, samples the control and address signal according to the delayed clock signal to obtain a second sample signal, and compares the first sample signal with the second sample signal to obtain the status signal.

The invention provides a Dynamic Random Access Memory (DRAM). In one embodiment, the DRAM is coupled to a DRAM controller, receives at least one control and address signal and a clock signal from the DRAM controller, and sends a status signal to the DRAM controller. In one embodiment, the DRAM comprises a delay unit, a first latch, a second latch, and a comparator. The delay unit delays the clock signal by a predetermined value to obtain a delayed clock signal. The first latch samples the control and address signal according to the clock signal to obtain a first sample signal. The second latch samples the control and address signal according to the delayed clock signal to obtain a second sample signal. The comparator compares the first sample signal with the second sample signal to obtain the status signal.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
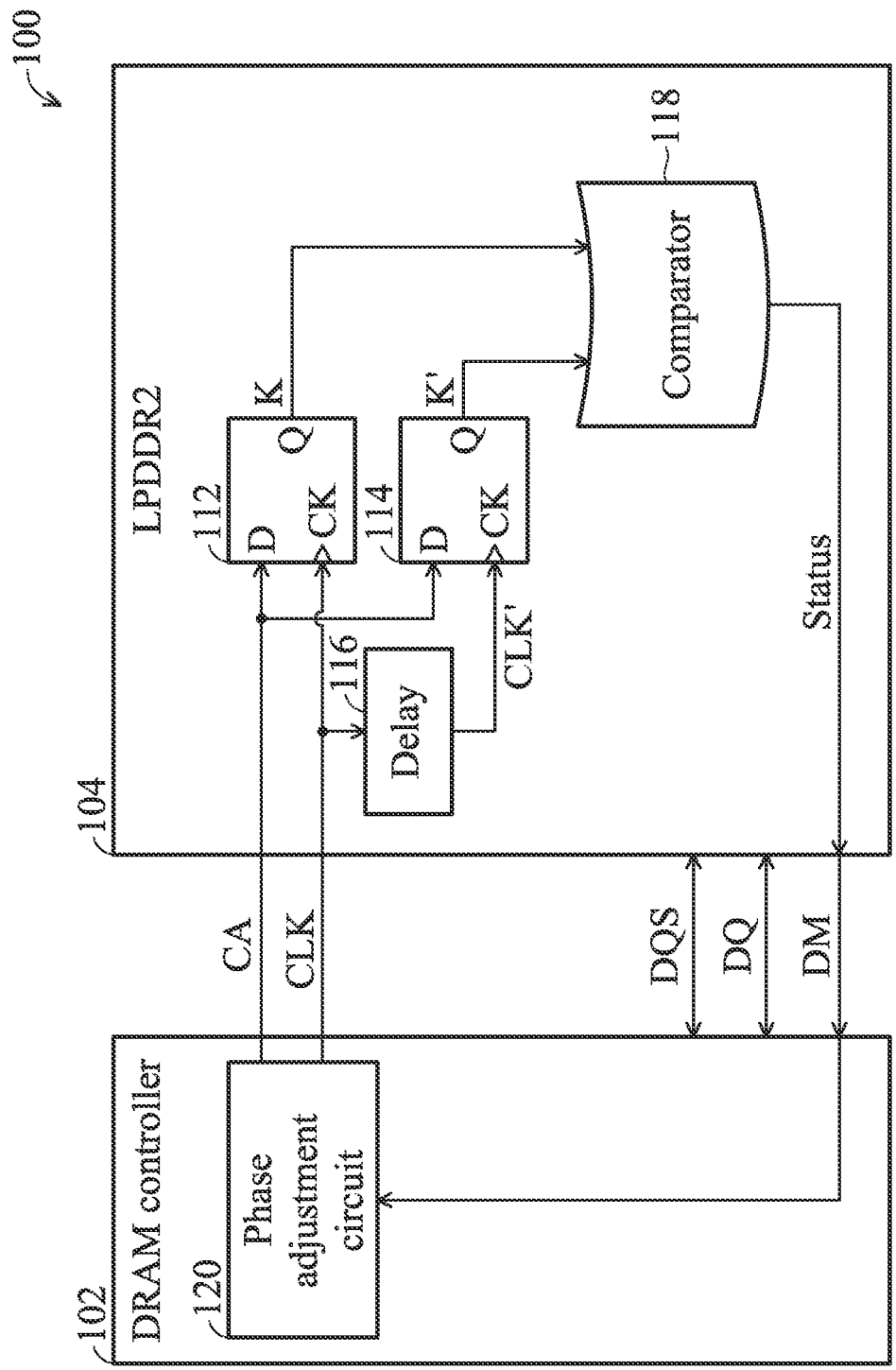
FIG. 1 is a block diagram of an electronic apparatus according to the invention.

Referring to FIG. 1, a block diagram of an electronic apparatus 100 according to the invention is shown. In one embodiment, the electronic apparatus 100 comprises a DRAM controller 102 and a DRAM 104. In one embodiment, the DRAM 104 is a Low power double data rate (LPDDR) DRAM, which may be an LPDDR2 DRAM or an LPDDR3 DRAM. The DRAM controller 102 is coupled to the DRAM 104 via a control and address bus comprising a plurality of control and address lines. The DRAM controller 102 sends a plurality of control and access signals CA comprising bit values of commands and addresses to the DRAM 104, wherein each of the control and address lines transmits one of the control and address signals from the DRAM controller 102 to the DRAM 104.

In addition to the control and address signals CA, the DRAM controller 102 also sends a clock signal CLK to the DRAM 102. Moreover, a data strobe line DQS, a data bus DQ, and a data mask line DM is also coupled between the DRAM controller 102 and the DRAM 104, wherein the data bus DQ transmits data between the DRAM controller 102 and the DRAM 104, the data strobe line DQS transmits a data strobe signal triggering data access, and the data mask line DM transmits a data mask signal indicating data validity.

When the DRAM 104 receives the control and address signals CA from the DRAM controller 102, the DRAM 104 accesses commands and addresses from the control and address signals according to the clock signal CLK. When the DRAM 104 is an LPDDR2(3) DRAM, the frequency of the control and address signals CA is the same as that of the clock signal CLK, and the phase difference between the clock signal CLK and the control and address signals CA must be kept at constant level to avoid data access errors. The phases of the clock signal CLK and the control and address signals CA, however, change with temperature, an operating voltage, and a manufacture process of the DRAM controller 102, and the phase difference between the clock signal CLK and the control and address signals CA therefore varies with time. A mechanism disclosed by the invention therefore enables the DRAM controller 102 and the DRAM 104 to cooperate to automatically adjust the phase of the clock signal CLK and the control and address signals CA to maintain the phase difference therebetween.

In one embodiment, the DRAM 104 comprises two latches 112 and 114, a delay unit 116, and a comparator 118. When the DRAM 104 receives the clock signal CLK, the delay unit 116 delays the clock signal CLK by a predetermined value to obtain a delayed clock signal CLK'. For example, the predetermined value represents a hold time margin and is programmable. In one embodiment, the predetermined value is equal to one-fourth of the clock cycle of the clock signal CLK. The latch 112 samples at least one control and address signal CA according to the clock signal CLK to obtain a first sample signal K. The latch 114 samples the at least one control and address signal CA according to the delayed clock signal CLK' to obtain a second sample signal K'. The comparator 118 then compares the first sample signal K with the second sample signal K' to obtain a status signal.

The DRAM 104 then sends the status signal to the DRAM controller 102. In one embodiment, the DRAM controller 102 comprises a phase adjustment circuit 120. The phase adjustment circuit 120 then adjusts the phase difference between the clock signal CLK and the control and address signal CA according to the value of the status signal sent from the DRAM 104. When the value of the status signal indicates that the value of the first sample signal K is equal to that of the second sample signal K', the phase adjustment circuit 120 reduces the phase difference between the clock signal CLK and the control and address signal CA. In one embodiment, the phase adjustment circuit 408 advances the timing of the control and address signal CA or retards the timings of the clock signal CLK to reduce the phase difference between the clock signal CLK and the control and address signal CA.

When the value of the status signal indicates that the value of the first sample signal K is different from that of the second sample signal K', the phase adjustment circuit 120 raises the phase difference between the clock signal CLK and the control and address signal CA. In one embodiment, the phase adjustment circuit 408 retards the timing of the control and address signal CA or advances the timings of the clock signal CLK to raise the phase difference between the clock signal CLK and the control and address signal CA. Because the phase adjustment circuit 120 dynamically adjusts the phases of the control and address signal CA or the clock signal CLK according to the value of the status signal, the phase difference between the control and address signal CA and the clock signal CLK are kept at constant level to avoid data access errors.

Figure 2:
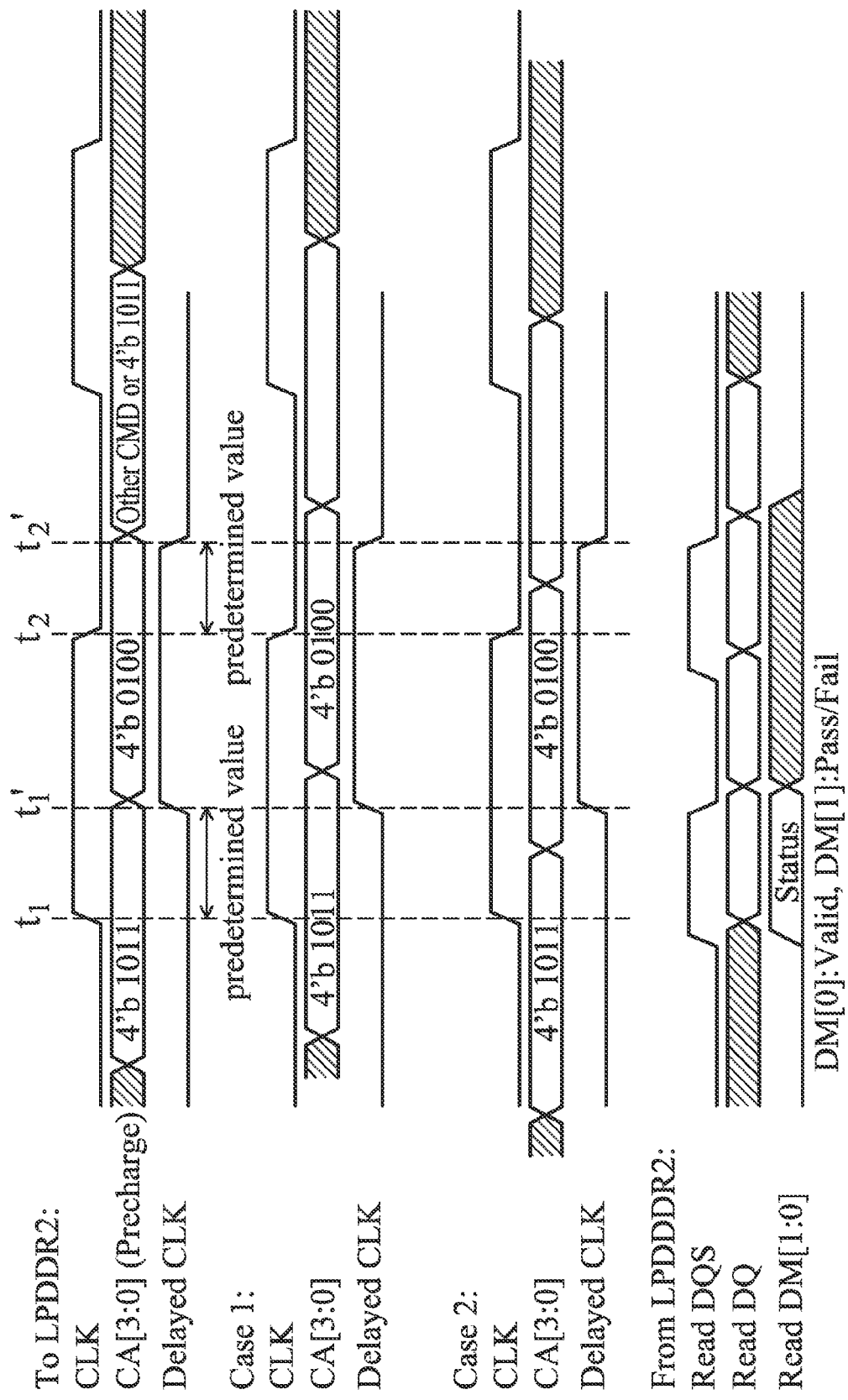
FIG. 2 is a schematic diagram of a detailed embodiment of waveforms of a control and address signal, a clock signal, a delayed clock signal, and a status signal according to the invention.

Referring to FIG. 2, a schematic diagram of a detailed embodiment of waveforms of the control and address signal CA, the clock signal CLK, the delayed clock signal, and the status signal according to the invention is shown. The highest portion of FIG. 2 shows a clock signal CLK and a control and address signal CA with a normal phase difference therebetween. Assume that the DRAM 104 samples the control and address signals CA when the control and address signals CA comprise a precharge command, and four control and address signals are sampled. A first cycle of the four control and address signals comprise four bits with data content of "1011". Because the DRAM controller 102 generates the data content in a subsequent cycle of the sampled control and address signals CA by inverting the values of the data content in a prior cycle of the sampled control and address signals CA, the second cycle of the four control and address signals comprise four bits with data content of "0100", and a third cycle of the four control and address signals comprise four bits with data content of "1011".

In one embodiment, the latch 112 of the DRAM 104 samples the control and address signals CA according to both a rising edge $t_1$ and a falling edge $t_2$ of the clock signal CLK. The latch 112 therefore generates a first sample signal K with first sample content 1011 corresponding to the rising edge $t_1$ and second sample content 0100 corresponding to the falling edge $t_2$. Similarly, the latch 114 of the DRAM 104 samples the control and address signals CA according to both a rising edge $t_1'$ and a falling edge $t_2'$ of the delayed clock signal CLK'. The latch 114 therefore generates a second sample signal K' with first sample content 1011 corresponding to the rising edge $t_1'$ and second sample content 0100 corresponding to the falling edge $t_2'$. When the comparator 118 compares the data content of the first sample signal K with the second sample signal K', the comparator 118 generates a status signal indicating that the value of the first sample signal K is equal to that of the second sample signal K'. The DRAM 104 then sends the status signal via a data mask line DM to the DRAM controller 102. The lowest portion of FIG. 2 shows the waveforms of the data mask signal DM, the data bus DQ, and the data strobe signal DQS sent from the DRAM 104 to the DRAM controller 102.

The middle portion of FIG. 2 shows two cases respectively corresponding to abnormal phase differences which are required to be adjusted. A first case corresponds to an excessively large phase difference between the clock signal CLK and the control and address signals CA. The first sample contents of the two sample signals K and K' are therefore both "1011", the second sample contents of the two sample signals K and K' are both "0100", and the comparator 118 generates a status signal indicating that the values of the first sample signal K are equal to that of the second sample signal K'. Thus, when the DRAM controller 102 receives a status signal indicating that the values of the first sample signal K are equal to those of the second sample signal K', the phase adjustment circuit 120 reduces the phase difference between the clock signal CLK and the control and address signals CA.

A second case corresponds to an excessively small phase difference between the clock signal CLK and the control and address signals CA. As shown in FIG. 2, the first sample content of the first sample signals K is "1011", but the first sample content of the second sample signals K' is "0100". Similarly, the second sample content of the first sample signals K is "0100", but the second sample content of the second sample signals K' is "1011". The comparator 118 therefore generates a status signal indicating that the values of the first sample signal K are different from those of the second sample signal K'. Thus, when the DRAM controller 102 receives a status signal indicating that the values of the first sample signal K are different from those of the second sample signal K', the phase adjustment circuit 120 raises the phase difference between the clock signal CLK and the control and address signals CA. Thus, the phase difference between the clock signal CLK and the control and address signals CA is automatically kept at a constant level. It should be noted that the status signal is only sent during the read process, because, during the write process, the DRAM controller 102 needs to use the data mask line DM to send a signal indicating which byte should be written into the DRAM 104.

Figure 3:
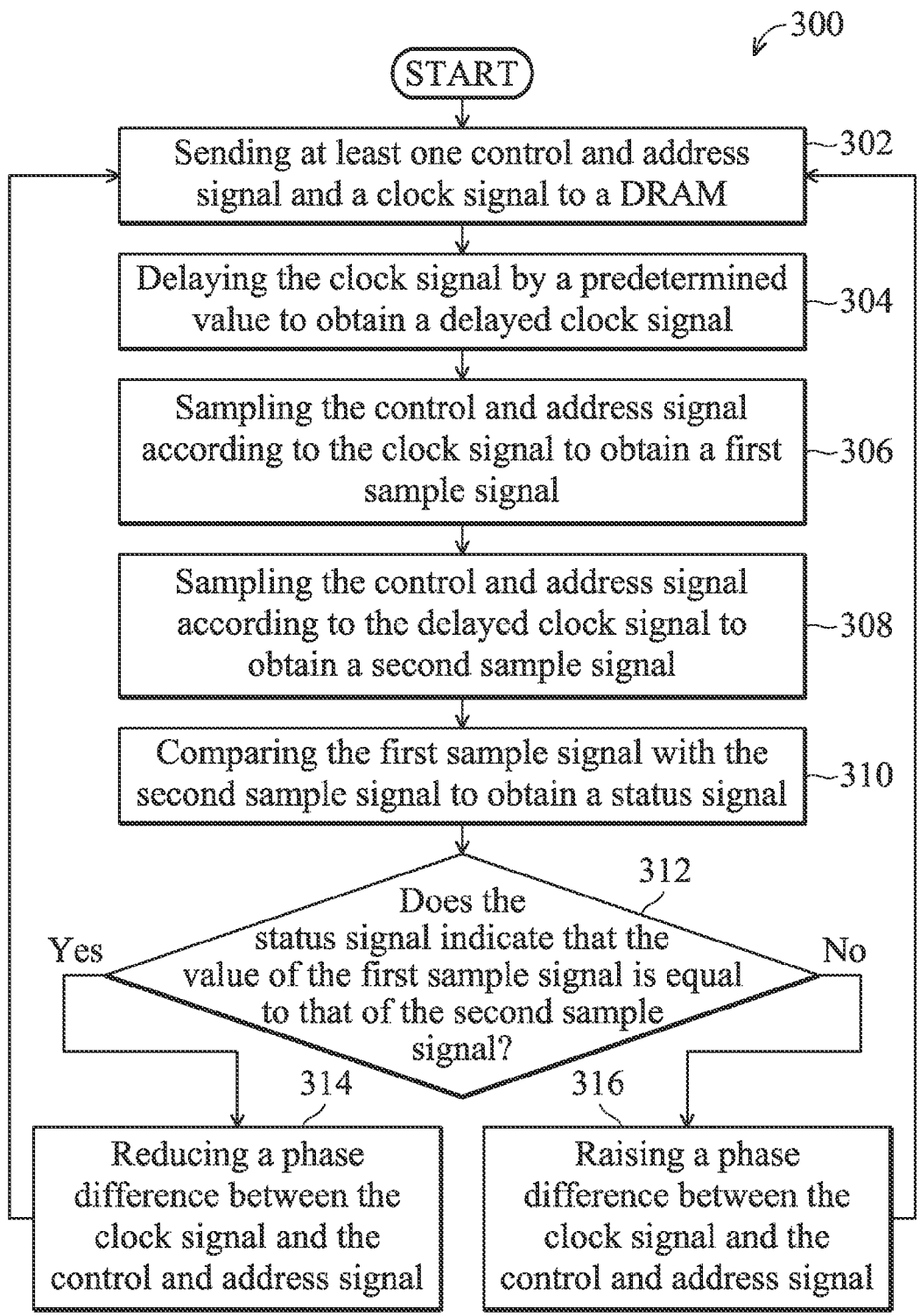
FIG. 3 is a flowchart of a method for automatically adjusting a phase difference between the control and address signal and the clock signal according to the invention.

Referring to FIG. 3, a flowchart of a method 300 for automatically adjusting a phase difference between the control and address signals CA and the clock signal CLK according to the invention is shown. First, the DRAM controller 102 sends at least one control and address signal and a clock signal to the DRAM 104 (step 302). The delay unit 116 of the DRAM 104 then delays the clock signal CLK by a predetermined value to obtain a delayed clock signal CLK' (step 304). The latch 112 of the DRAM 104 then samples the control and address signal CA according to the clock signal CLK to obtain a first sample signal K (step 306). The latch 114 of the DRAM 104 then samples the control and address signal CA according to the delayed clock signal CLK' to obtain a second sample signal K' (step 308). The comparator 118 of the DRAM 104 then compares the first sample signal K with the second sample signal K' to obtain a status signal (step 310), and sends the status signal to the DRAM controller 102. When the status signal indicates that the value of the first sample signal K is equal to that of the second sample signal K' (step 312), the DRAM controller 102 reduces a phase difference between the clock signal CLK and the control and address signal CA (step 314). When the status signal indicates that the value of the first sample signal K is different from that of the second sample signal K' (step 312), the DRAM controller 102 raises the phase difference between the clock signal CLK and the control and address signal CA (step 316).

Figure 4:
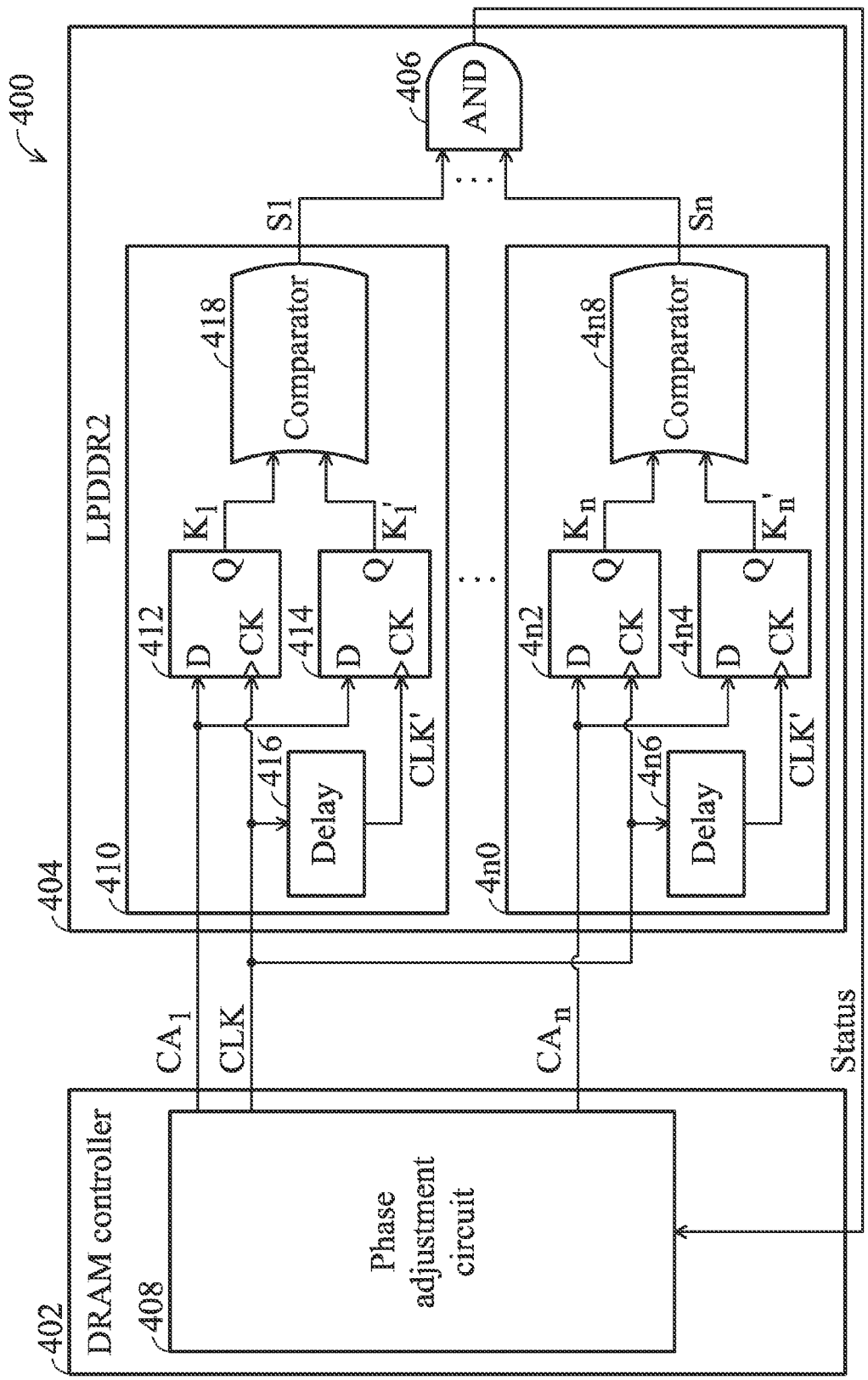
FIG. 4 is a block diagram of another embodiment of an electronic apparatus according to the invention.

Referring to FIG. 4, a block diagram of another embodiment of an electronic apparatus 400 according to the invention is shown. In one embodiment, the electronic apparatus 400 comprises a DRAM controller 402 and a DRAM 404. The DRAM controller 402 sends a clock signal CLK and a plurality of control and address signals $CA_1, \ldots, CA_n$ to the DRAM 404. The DRAM 404 generates a status signal according to the plurality of control and address signals $CA_1, \ldots, CA_n$. The DRAM 404 comprises a plurality of evaluation circuits 410, ..., 4n0, each of the evaluation circuits comprises a delay unit, two latches, and a comparator as the DRAM 104 shown in FIG. 1.

For example, when the DRAM 404 receives the clock signal CLK, the delay unit 416 delays the clock signal CLK by a predetermined value to obtain a delayed clock signal CLK'. The latch 412 of the evaluation circuit 410 then samples the control and address signal $CA_1$ according to the clock signal CLK to obtain a first sample signal $K_1$. The latch 414 of the evaluation circuit 410 then samples the control and address signal $CA_1$ according to the delayed clock signal CLK' to obtain a second sample signal $K_1'$. The comparator 118 of the evaluation circuit 410 then compares the first sample signal $K_1$ with the second sample signal $K_1'$ to obtain a comparison result signal $S_1$. The evaluation circuits 410, ..., 4n0 therefore generate a plurality of comparison result signals $S_1, \ldots, S_n$. An AND gate 406 of the DRAM 404 and then performs an AND operation on the comparison result signals $S_1, \ldots, S_n$ to generate a status signal.

The status signal is then sent to a phase adjustment circuit 408 of the DRAM controller 402, and the phase adjustment circuit 408 adjusts the phase difference between the clock signal CLK and the control and address signals $CA_1, \ldots, CA_n$ according to the status signal. For example, when the status signal indicates that all of the values of the first sample signals $K_1, \ldots, K_n$ are respectively equal to those of the second sample signals $K_1', \ldots, K_n'$, the DRAM controller 402 reduces a phase difference between the clock signal CLK and the control and address signal $CA_1, \ldots, CA_n$. When the status signal indicates that any of the values of the first sample signals $K_1, \ldots, K_n$ is different from those of the second sample signals $K_1', \ldots, K_n'$, the DRAM controller 402 raises a phase difference between the clock signal CLK and the control and address signal $CA_1, \ldots, CA_n$.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic apparatus, comprising:
   a Dynamic Random Access Memory (DRAM), receiving at least one control and address signal and a clock signal, delaying the clock signal by a predetermined value to obtain a delayed clock signal, sampling the control and address signal according to the clock signal to obtain a first sample signal, sampling the control and address signal according to the delayed clock signal to obtain a second sample signal, and comparing the first sample signal with the second sample signal to obtain a status signal; and
   a DRAM controller, sending the at least one control and address signal and the clock signal to the DRAM, receiving the status signal from the DRAM, and adjusting a phase difference between the clock signal and the at least one control and address signal according to the status signal.

2. The electronic apparatus as claimed in claim 1, wherein the DRAM comprises:
   a delay unit, delaying the clock signal by the predetermined value to obtain the delayed clock signal;
   a first latch, sampling the control and address signal according to the clock signal to obtain the first sample signal;
   a second latch, sampling the control and address signal according to the delayed clock signal to obtain the second sample signal; and a comparator, comparing the first sample signal with the second sample signal to obtain the status signal.

3. The electronic apparatus as claimed in claim 1, wherein the DRAM controller comprises:
a phase adjustment circuit, adjusting the phase difference between the clock signal and the control and address signal according to the status signal.

4. The electronic apparatus as claimed in claim 1, wherein the DRAM controller reduces the phase difference between the clock signal and the control and address signal when the status signal indicates that a value of the first sample signal is equal to a value of the second sample signal, and raises the phase difference between the clock signal and the control and address signal when the status signal indicates that the value of the first sample signal is different from the value of the second sample signal.

5. The electronic apparatus as claimed in claim 4, wherein the DRAM controller reduces the phase difference between the clock signal and the control and address signal by advancing a timing of the control and address signal, and raises the phase difference between the clock signal and the control and address signal by retarding the timing of the control and address signal.

6. The electronic apparatus as claimed in claim 4, wherein the DRAM controller reduces the phase difference between the clock signal and the control and address signal by retarding the timing of the clock signal, and raises the phase difference between the clock signal and the control and address signal by advancing the timing of the clock signal.

7. The electronic apparatus as claimed in claim 1, wherein the DRAM controller generates data content of the control and address signal sent to the DRAM according to the clock signal by repeatedly inverting the data content corresponding to a prior data cycle of the control and address signal to obtain the data content corresponding to a subsequent data cycle of the control and address signal.

8. The electronic apparatus as claimed in claim 1, wherein the DRAM samples the control and address signal according to both a rising edge and a falling edge of the clock signal to obtain the first sample signal, and samples the control and address signal according to both a rising edge and a falling edge of the delayed clock signal to obtain the second sample signal.

9. The electronic apparatus as claimed in claim 1, wherein the DRAM samples the control and address signal to obtain the first sample signal and the second sample signal when the control and address signal comprises a pre-charge command.

10. The electronic apparatus as claimed in claim 1, wherein the DRAM sends the status signal to the DRAM controller via a data mask line coupled between the DRAM and the DRAM controller.

11. The electronic apparatus as claimed in claim 1, wherein the predetermined value is set to be one-fourth of a clock cycle of the clock signal.

12. The electronic apparatus as claimed in claim 1, wherein the DRAM is a low power double data rate (LPDDR) DRAM or an LPDDR2 DRAM or an LPDDR3 DRAM.

13. The electronic apparatus as claimed in claim 1, wherein the predetermined value represents a hold time margin.

14. The electronic apparatus as claimed in claim 1, wherein the predetermined value is programmable.

15. A Dynamic Random Access Memory (DRAM) controller, coupled to a DRAM, sending at least one control and address signal and a clock signal to the DRAM, receiving a status signal from the DRAM, comprising:
a phase adjustment circuit, adjusting a phase difference between the clock signal and the at least one control and address signal sent to the DRAM according to the status signal,
wherein the DRAM delays the clock signal by a predetermined value to obtain a delayed clock signal, samples the control and address signal according to the clock signal to obtain a first sample signal, samples the control and address signal according to the delayed clock signal to obtain a second sample signal, and compares the first sample signal with the second sample signal to obtain the status signal.

16. The DRAM controller as claimed in claim 15, wherein the phase adjustment circuit reduces the phase difference between the clock signal and the control and address signal when the status signal indicates that a value of the first sample signal is equal to a value of the second sample signal, and raises the phase difference between the clock signal and the control and address signal when the status signal indicates that the value of the first sample signal is different from the value of the second sample signal.

17. The DRAM controller as claimed in claim 15, wherein the phase adjustment circuit reduces the phase difference between the clock signal and the control and address signal by advancing a timing of the control and address signal, and raises the phase difference between the clock signal and the control and address signal by retarding the timing of the control and address signal.

18. The DRAM controller as claimed in claim 15, wherein the phase adjustment circuit reduces the phase difference between the clock signal and the control and address signal by retarding the timing of the clock signal, and raises the phase difference between the clock signal and the control and address signal by advancing the timing of the clock signal.

19. The DRAM controller as claimed in claim 15, wherein the DRAM controller generates data content of the control and address signal sent to the DRAM by repeatedly inverting the data content corresponding to a prior data cycle of the control and address signal to obtain the data content corresponding to a subsequent data cycle of the control and address signal.

20. The DRAM controller as claimed in claim 15, wherein the predetermined value is set to be one-fourth of a clock cycle of the clock signal.

21. The DRAM controller as claimed in claim 15, wherein the predetermined value represents a hold time margin.

22. The DRAM controller as claimed in claim 15, wherein the predetermined value is programmable.

23. A Dynamic Random Access Memory (DRAM), coupled to a DRAM controller, receiving at least one control and address signal and a clock signal from the DRAM controller, sending a status signal to the DRAM controller, comprising:
a delay unit, delaying the clock signal by a predetermined value to obtain a delayed clock signal;
a first latch, sampling the control and address signal according to the clock signal to obtain a first sample signal;
a second latch, sampling the control and address signal according to the delayed clock signal to obtain a second sample signal; and
a comparator, comparing the first sample signal with the second sample signal to obtain the status signal.

24. The DRAM as claimed in claim 23, wherein the DRAM controller adjusts a phase difference between the clock signal and the at least one control and address signal according to the status signal.

25. The DRAM as claimed in claim 23, wherein the first latch samples the control and address signal according to both a rising edge and a falling edge of the clock signal to obtain the first sample signal, and the second latch samples the control and address signal according to both a rising edge and a falling edge of the delayed clock signal to obtain the second sample signal.

26. The DRAM as claimed in claim 23, wherein the first latch and the second latch sample the control and address signal to obtain the first sample signal and the second sample signal when the control and address signal comprises a pre-charge command.

27. The DRAM as claimed in claim 23, wherein the DRAM sends the status signal to the DRAM controller via a data mask line coupled between the DRAM and the DRAM controller.

28. The DRAM as claimed in claim 23, wherein the predetermined value is set to be one-fourth of a clock cycle of the clock signal.

29. The DRAM as claimed in claim 23, wherein the DRAM is a low power double data rate (LPDDR) DRAM or an LPDDR2 DRAM or an LPDDR3 DRAM.

30. The DRAM as claimed in claim 23, wherein the predetermined value represents a hold time margin.

31. The DRAM as claimed in claim 23, wherein the predetermined value is programmable.

\* \* \* \* \*